United States Patent
Pan et al.

(10) Patent No.: US 7,834,379 B2
(45) Date of Patent: Nov. 16, 2010

(54) AVALANCHE PHOTODIODE WITH EDGE BREAKDOWN SUPPRESSION

(75) Inventors: Zhong Pan, San Jose, CA (US); David Venables, Sunnyvale, CA (US); Craig Ciesla, Mountain View, CA (US)

(73) Assignee: JDS Uniphase Corporation, Milpitas, CA (US)

( * ) Notice: Subject to any disclaimer, the term of this patent is extended or adjusted under 35 U.S.C. 154(b) by 143 days.

(21) Appl. No.: 12/173,189

(22) Filed: Jul. 15, 2008

(65) Prior Publication Data

US 2009/0020782 A1    Jan. 22, 2009

Related U.S. Application Data

(60) Provisional application No. 60/950,403, filed on Jul. 18, 2007.

(51) Int. Cl.
*H01L 31/18* (2006.01)
(52) U.S. Cl. .................... 257/185; 257/99; 257/186; 257/436; 257/E31.022; 257/E31.061; 257/E31.064; 438/69; 438/87; 438/91
(58) Field of Classification Search ................ 257/99, 257/185–186, 436; 438/69, 87, 91
See application file for complete search history.

(56) References Cited

U.S. PATENT DOCUMENTS

| | | | | |
|---|---|---|---|---|
| 4,700,209 | A | 10/1987 | Webb | |
| 4,876,209 | A | 10/1989 | Forrest | |
| 5,144,381 | A * | 9/1992 | Furuyama et al. | 257/186 |
| 5,569,942 | A * | 10/1996 | Kusakabe | 257/186 |
| 5,866,936 | A * | 2/1999 | Hasnain et al. | 257/452 |
| 6,015,721 | A * | 1/2000 | Kim | 438/91 |
| 6,492,239 | B2 | 12/2002 | Yang et al. | |
| 6,515,315 | B1 * | 2/2003 | Itzler et al. | 257/186 |
| 6,743,657 | B2 | 6/2004 | Dries et al. | |
| 7,087,882 | B1 | 8/2006 | Dries et al. | |
| 7,378,689 | B2 * | 5/2008 | Itzler et al. | 257/186 |

* cited by examiner

*Primary Examiner*—A. Sefer
(74) *Attorney, Agent, or Firm*—Matthew A. Pequignot; Pequignot + Myers LLC (57) ABSTRACT

The invention relates to an avalanche photodiode having enhanced gain uniformity enabled by a tailored diffused p-n junction profile. The tailoring is achieved by a two stage doping process incorporating a solid source diffusion in combination with conventional gas source diffusion. The solid source diffusion material is selected for its solubility to the dopant compared to the solubility of the multiplication layer to dopant. The solid source has a diameter between the first and second diffusion windows. Thus, there are three distinct diffusion regions during the second diffusion. The dopant in the multiplication layer at the edge region, the dopant from the solid source material with a relatively higher dopant concentration (limited by the solubility of the dopant in the solid source material) at the intermediate region, and the central region exposed to an infinite diffusion source from the solid source material as it is continually charged with new dopant from the external gas source. The result is that both the dopant concentration and the diffusion depth decrease gradually from the center to the edge of the device. This tailored diffusion profile enables control of the electric field distribution such that edge breakdown is suppressed.

21 Claims, 10 Drawing Sheets

AVALANCHE PHOTODIODE WITH EDGE BREAKDOWN SUPPRESSION

CROSS-REFERENCE TO RELATED APPLICATIONS

This application claims priority from U.S. Provisional Application No. 60/950,403 filed Jul. 18, 2007 herein incorporated by reference.

TECHNICAL FIELD

The present application relates to an avalanche photodiode (APD) having an avalanche multiplication structure to suppress edge breakdown. The present invention further relates to a method of making an avalanche multiplication structure in an avalanche photodiode with edge breakdown suppression.

BACKGROUND OF THE INVENTION

Avalanche photodiode structures that have separate absorption and multiplication layers (SAM-APDs) can provide electrical output signals with high fidelity (i.e. low noise). For use in telecommunications applications, the APD is electrically biased such that the electrical response is substantially linear with optical power. Although the APD requires higher operating voltages, the internal gain of the APD provides a significant increase in receiver sensitivity compared to a PIN photodiode. This is important for realizing high speed optical receivers for high data rate communications networks.

A critical feature of APD design is to maintain gain uniformity across the active region of the device. The active region comprises a p-n junction formed by diffusion in the multiplication layer. However, the edge curvature of the diffusion profile causes locally elevated electric fields at the edge of the active region. The tendency for increase of electric fields at the edge of the active region is a basic property of the physics of finite-size planar p-n junctions. As seen in a prior art diode structure shown in FIG. 1, the electric field at the edge (E1 for single diffusion, and E1, E2 for double diffusion) is usually higher than that at center Ec due to the curvature effect.

The p-n junction is formed by opening a window, such as by photolithography, in a passivation layer above an intrinsic multiplication layer. Solid or gas sources are used to deliver a p-type dopant, such as zinc to the window, which is diffused under high heat into the crystal lattice of the multiplication layer. Because the flow of dopant molecules is both lateral and transverse a curved edge region is formed underneath the edges of the window. This curved portion of the p-n junction has a higher electric field than the planar portions in the center of the window.

These increased edge fields lead to larger gain at the edge of the active region which causes a poor gain uniformity and premature breakdown, typically referred to as "edge breakdown". The poor gain uniformity has markedly deleterious effects on device performance, particularly the noise performance and bandwidth of the APD. For practical SAM-APDs, the breakdown-voltage uniformity across the entire active region should be within 5 to 10 percent, and preferably within one percent. The breakdown-voltage is the voltage at which the p-n junction is sufficiently reverse-biased to conduct a large current arising from a self-sustaining avalanche process, even in the absence of continuous optical power.

Reduction of the electric field intensity at the edge of the active region is a key for alleviating edge breakdown. One published technique for controlling edge breakdown in planar junctions is through controlling the diffused pn-junction profile (also called diffusion profile). Ultimately, the key to suppress the edge breakdown is to have a smooth transition profile at the edge of the active region.

Figure 1:
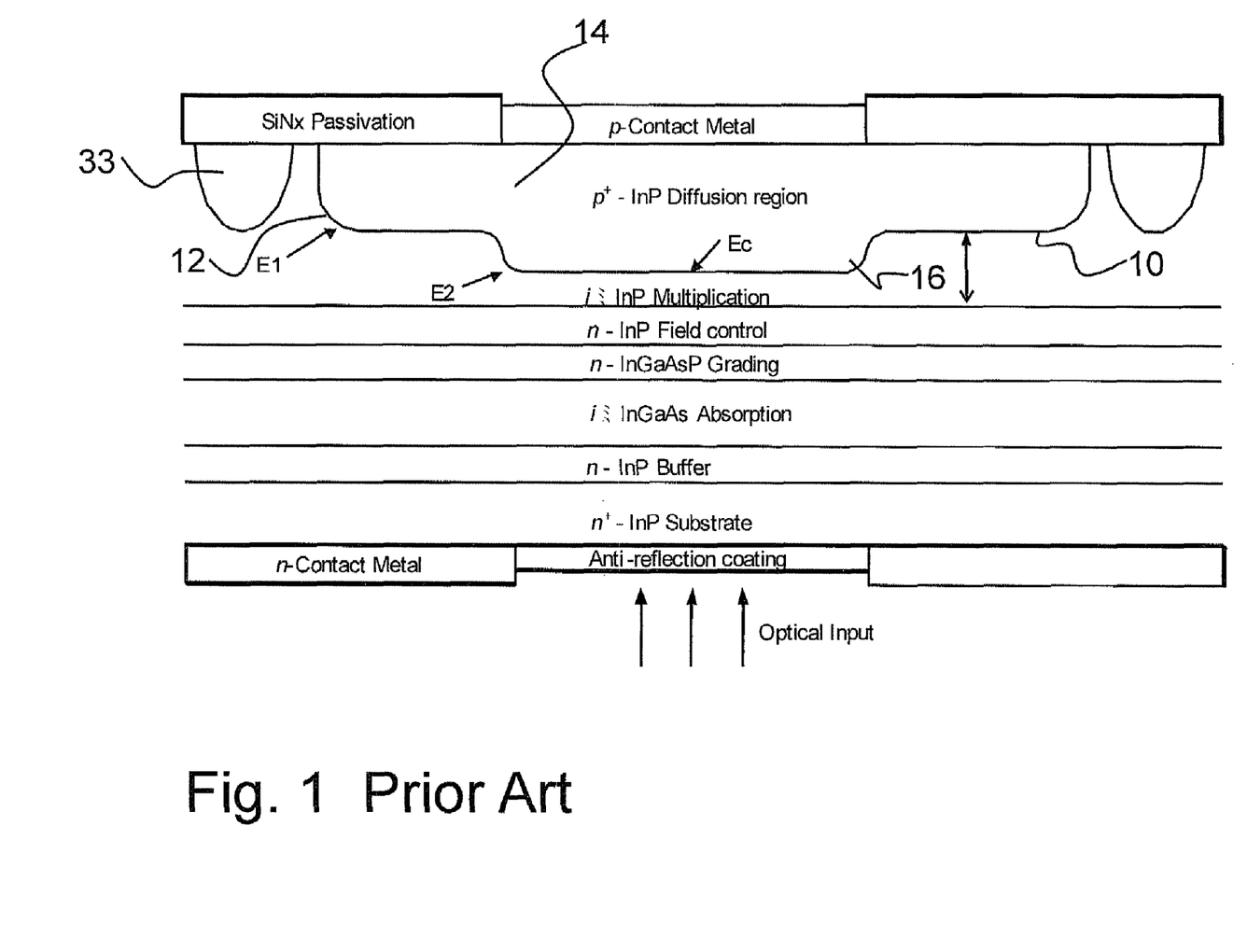
FIG. 1 is a schematic cross-section of a prior art back illuminated SAM-APD formed by double diffusion.

As illustrated in FIG. 1, a p-n junction 10 is shaped to create a thicker multiplication layer with consequently lower electric fields at the edge 12 of the active region 14. The method for realizing such a shaped diffusion profile 10 is through the use of double diffusions of the same dopant (e.g. zinc) employing different diameter concentric windows for successive diffusions to different depths. The second diffusion edge can be smoothed out with the drive-in help of the dopant from the first diffusion region. Therefore, the curvature effect of the second diffusion edge 16 is alleviated. An example of this technique is disclosed in U.S. Pat. No. 6,515,315 by M. A. Itzler et al, assigned to the common owner of the present invention. The diffusion depth of the first and second diffusion steps should be very carefully optimized to achieve the highest electric field located in the center region Ec. However, in reality, the design window is quite small. If the step between the first and second diffusion is too small in depth, the curvature effect of the first diffusion edge becomes severe, resulting in electrical field E1 larger than Ec. And if the step is too big, it will not provide enough help to smooth out the second diffusion corner, resulting in electrical field E2 larger than Ec. It gives a very high requirement to the control of the diffusion process.

Yang et al. describe a method to form a step-like diffusion profile to suppress the edge breakdown in a single diffusion process step in U.S. Pat. No. 6,492,239. Before diffusion, a 0.3 um step in the InP is formed through wet chemical etching. However, in use the etch depth and sidewall curvature is very difficult to control by wet chemical etching. The diffused pn-junction profile strongly depends on a predetermined depth and curvature of etching. The alternative method is dry etching which can control the etch depth and the sidewall profile much better. But dry etching damages the InP surface severely and the surface condition/reconstruction is critical to achieve a repeatable diffusion profile.

Accordingly, a method of forming a smooth edge transition without a sharp curvature in the diffusion profile in a SAM-APD that will further lower electric fields in the edge of the active region remains highly desirable. An APD exhibiting improved gain uniformity across the active region of the device is equally desired.

SUMMARY OF THE INVENTION

Figure 2:
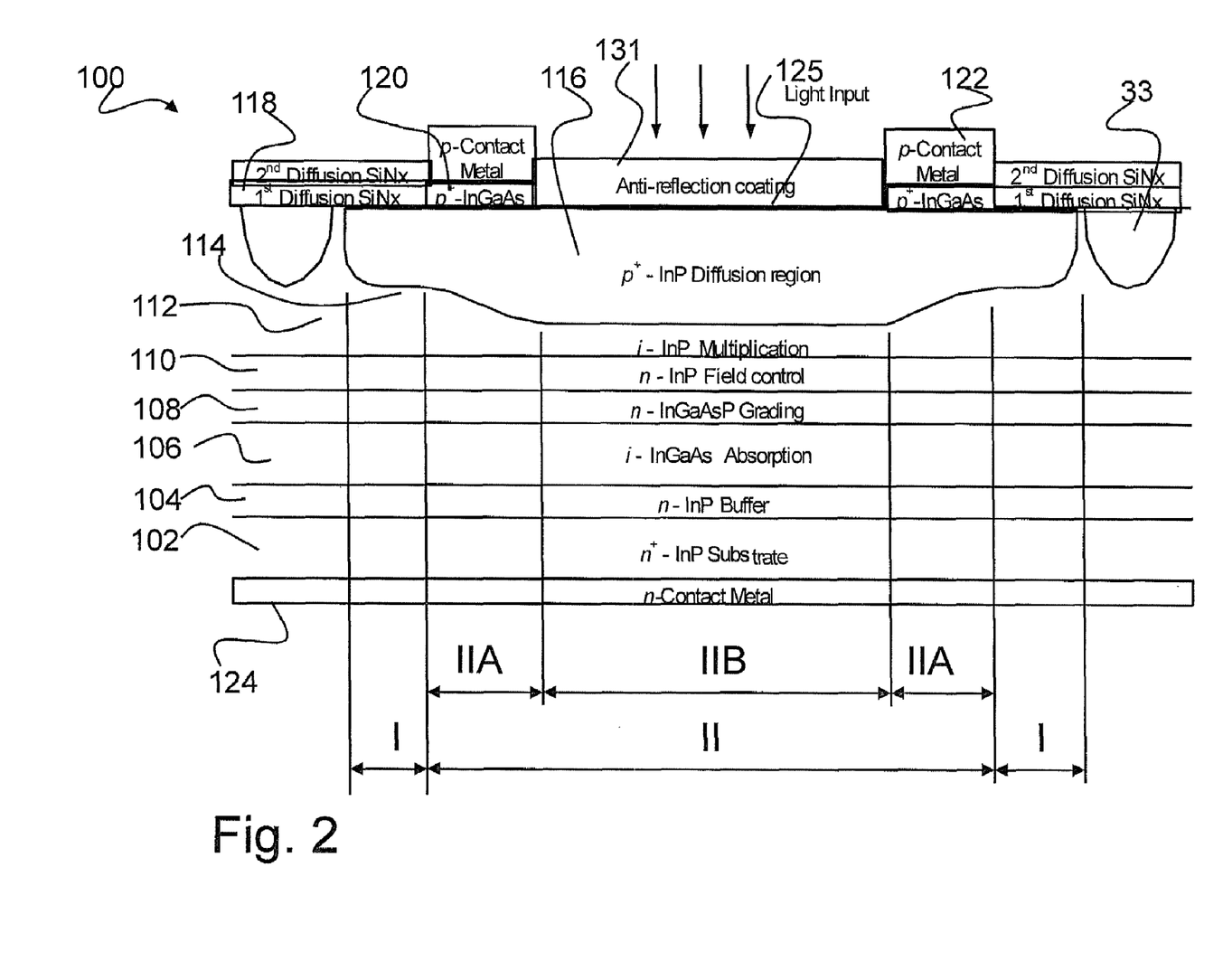
FIG. 2 is a schematic cross-section of a front illuminated SAM-APD in accordance with the present invention.

The present invention has found that an avalanche photodiode can provide enhanced gain uniformity by tailoring the diffused p-n junction profile. The tailoring is achieved by a two stage doping process incorporating a solid source diffusion in combination with conventional gas source diffusion. The solid source diffusion material is selected such that the solubility of the dopant is higher in the solid source diffusion material compared to the multiplication layer material. The solid source material is patterned so that is has a finite lateral extent. Prior to a first diffusion step, a window is created that exposes the multiplication layer material and the solid source material. As shown in FIG. 2, during the first diffusion, a dopant containing gas impinges on the window, diffusing dopant into the multiplication layer directly in region I, and in region II diffusing dopant into the multiplication layer material after first diffusing through the solid source material.

Prior to the second diffusion, a new window is opened exclusively in the central portion of the solid source material, thus preventing further introduction of new dopant in region I and preventing further introduction of new dopant in a portion of region II (labeled as IIA). Thus, there are three distinct diffusion regions during the second diffusion. Region I comprises a finite source diffusion with relatively low dopant concentration (limited by the solubility of the dopant in the multiplication layer). Region IIA comprises a finite source diffusion from the solid source material with a relatively higher dopant concentration (limited by the solubility of the dopant in the solid source material). Region IIB comprises an infinite diffusion source from the solid source material as it is continually charged with new dopant from the external gas source. The result is that both the dopant concentration and the diffusion depth decrease gradually from the center to the edge of the device. This tailored diffusion profile enables control of the electric field distribution such that edge breakdown is suppressed.

The solid source also comprises a material which is lattice matched or at least compatible with the crystal structure growth for epitaxial growth on the multiplication layer. The solid diffusion source can additionally serve as a contact layer for the completed device. In a preferred embodiment, a thin InGaAs slab of finite lateral extent is selected as a finite solid source for the second diffusion into the InP multiplication layer to smooth the transition between the first and second diffusion profile.

Accordingly, an object of the present invention is to provide a separate absorption and multiplication structure avalanche photodiode (SAM-APD) comprising:

an epitaxial layer structure grown on an n-doped substrate in order as follows:
  an n-doped buffer layer;
  an unintentionally doped absorption layer;
  a grading layer;
  an n-doped field control layer;
  an unintentionally doped multiplication layer, including a diffused p-n junction having a diffusion profile and an active region comprising a diffusion region in the multiplication layer; and
  a solid source material layer;

the device further comprising:
  a p-contact applied in electrical contact with the active region;
  a light input window; and
  an n-contact in electrical contact with the n-doped substrate, wherein the diffusion profile of the p-n junction comprises a smooth edge transition for suppressing edge breakdown.

In an aspect of the invention the solid source material layer comprises a material having a solubility to a dopant that is at least five times higher than a solubility of the multiplication layer to the dopant.

Thus a further aspect of the present invention provides a SAM-APD as defined above, wherein the active region comprises an edge zone, an intermediate zone and a central zone arranged concentrically in monotonically increasing depth, and dopant concentration.

In embodiments of the invention, a method of making a diffused p-n junction in the fabrication of a separate amplification and multiplication (SAM) avalanche photodiode (APD) comprises the steps of:

growing a thin layer of solid source material on a multiplication layer;

etching the solid source material to a dimension having a diameter Dint, exposing the multiplication layer around its edge;

depositing a first protection layer over the exposed multiplication layer and solid source material;

etching the first protection layer to open a first diffusion window having a diameter De larger than Dint, exposing the solid source material and a surrounding edge zone of the multiplication layer;

conducting a first diffusion step by providing a source of dopant in an inert gas carrier over the surfaces exposed in the first diffusion window, and applying heat to cause the dopant to diffuse into the crystal lattice of the multiplication layer in the edge zone, and into the solid source in an intermediate and central zone;

depositing a second protection layer over the first diffusion window;

etching the second protection layer to expose a second diffusion window having a diameter Dc smaller than Dint positioned concentrically over the solid source material;

conducting a second diffusion step by providing a source of dopant over the solid source material exposed in the second diffusion window, and applying heat to cause dopant diffused in the multiplication layer to migrate deeper into the multiplication layer in the edge zone, and to cause dopant diffused in the solid source material to migrate into the multiplication layer in the intermediate and central zone in greater concentration and deeper than in the edge zone, and to cause ions introduced through the second diffusion window to migrate into the multiplication layer in the central zone in greater concentration and deeper than in the intermediate zone, wherein the diffused p-n junction in the multiplication layer has a diffusion profile with a smooth edge transition curve from the edge zone to the central zone.

The method of making a diffused p-n junction as defined above, wherein the multiplication layer is selected from the group consisting of InP and GaAs and the solid source material is selected from the group consisting of InGaAs and AlGaAs.

The method of making a diffused p-n junction as defined above, wherein a solid source material of InGaAs has a thickness of 50-500 nm.

BRIEF DESCRIPTION OF THE DRAWINGS

Further features and advantages of the present invention will become apparent from the following detailed description, taken in combination with the appended drawings, in which:

FIG. 4 A-J are a schematic illustrations of the process flow of the method of forming a diffusion profile for a front illuminated APD in accordance with the present invention;

It will be noted that throughout the appended drawings, like features are identified by like reference numerals.

DETAILED DESCRIPTION OF THE PREFERRED EMBODIMENT

The present invention provides an SAM-APD having an avalanche multiplication structure to suppress edge breakdown. The schematic structure is shown in FIG. 2. The APD 100 has a separate absorption and multiplication (SAM) structure. The SAM structure is grown on n-doped InP substrate 102. A typical SAM layer structure consists of an n-doped InP buffer layer 104 (0.3-1 µm), an unintentionally doped InGaAs absorption layer 106 (0.4-2 µm), a GaInAsP grading layer 108 (0.05-0.2 µm), an n-doped InP field control layer 110 and an unintentionally doped InP multiplication layer 112. The multiplication layer 112 includes the p-n junction 114 at the diffusion profile formed by Zn diffusion. A thin InGaAs layer slab 120 is grown on InP multiplication layer 112. The thickness of this InGaAs slab layer 120 is in the range of 0.05-0.5 µm. It can be unintentionally doped or heavily doped with p-type dopant such as Zn. The multiplication layer 112, active region 116 and guard rings 33 are encapsulated with a protective layer 118 of SiNx or similar material. The InGaAs slab layer 120 is etched in the finished device to an annular shape surrounding the light input window 125 having a diameter smaller than the active region 116, which is preferably coated with an antireflection coating. The slab ring 120 can be the p contact, and a p contact metal 122 can be plated over it. An n contact 124 is plated on the InP substrate 102.

The edge breakdown is suppressed by providing a diffusion profile which decreases gradually both in depth and concentration from a center region to a peripheral edge region. This graded and tailored diffusion profile is created by the drive-in diffusion from the limited solid source, preferably of InGaAs. The limited solid source slab has a diameter smaller than the first diffusion window and larger than the second diffusion window to provide gradual tapering of the diffusion between the two. A structure including an InGaAs slab to tailor the diffusion profile is not only applied to front-illuminated APD, but also applied to back-illuminated APD.

Figure 3:
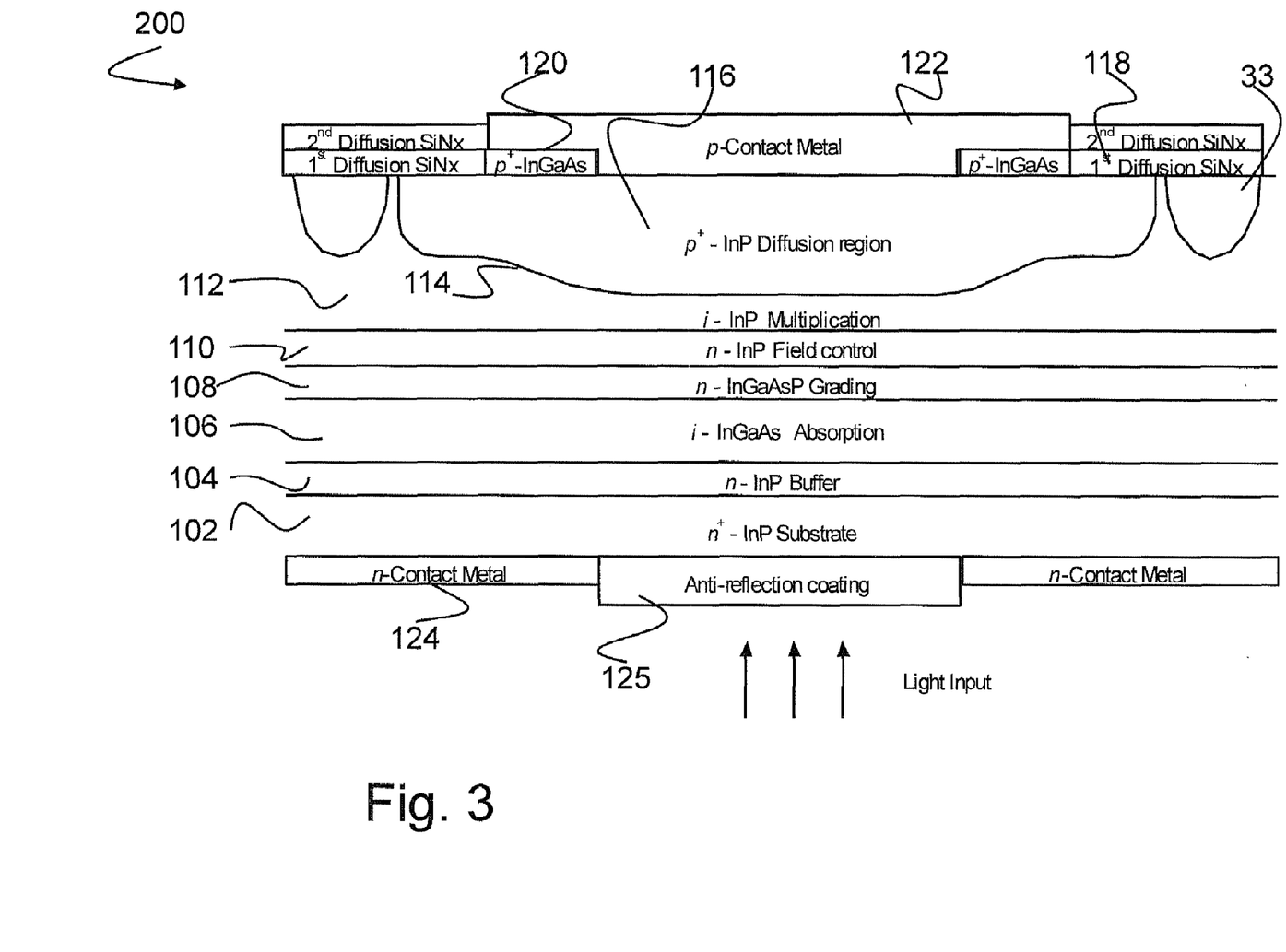
FIG. 3 is a schematic cross-section of a back illuminated SAM-APD in accordance with the present invention.

A back-illuminated APD 200 in accordance with the present invention is shown in FIG. 3. Its SAM structure is closely matched to the front illuminated 100 as seen in the like numerals of the layer structure. The p contact 122 is applied over the InGaAs slab 120. While a light input window 125 with an antireflection coating 131 is provided in the n contact 124 on the substrate 102.

A related concept is the use of "floating" guard rings 33, as shown in FIGS. 1, 2 and 3, which have the same doping as the central area of the active region but are electrically isolated from the central area. Their function is to lower the surface electric fields when the junction is biased. The use of guard rings may be combined with the teaching of the present invention. The guard ring 33 is formed simultaneously with the first diffusion step creating the active area 116.

Figure 4A:
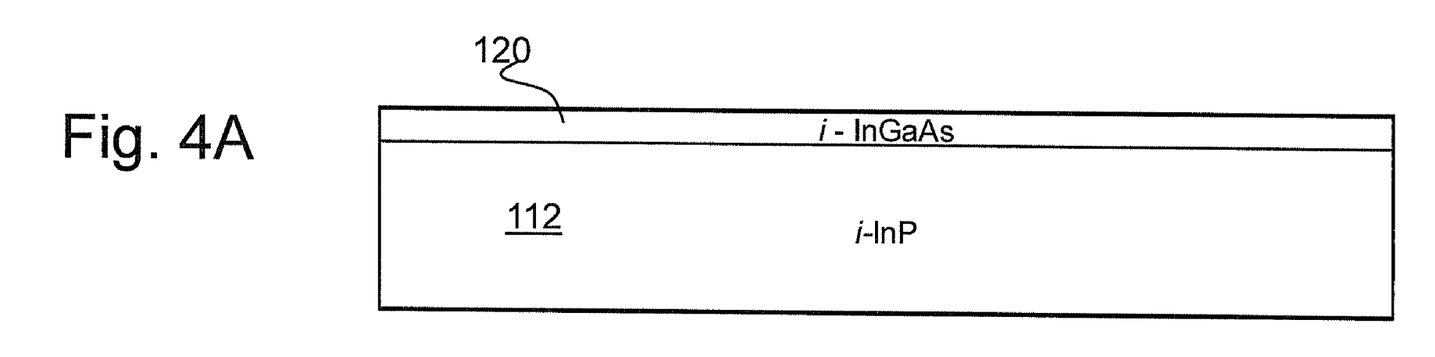
Figure 4B:
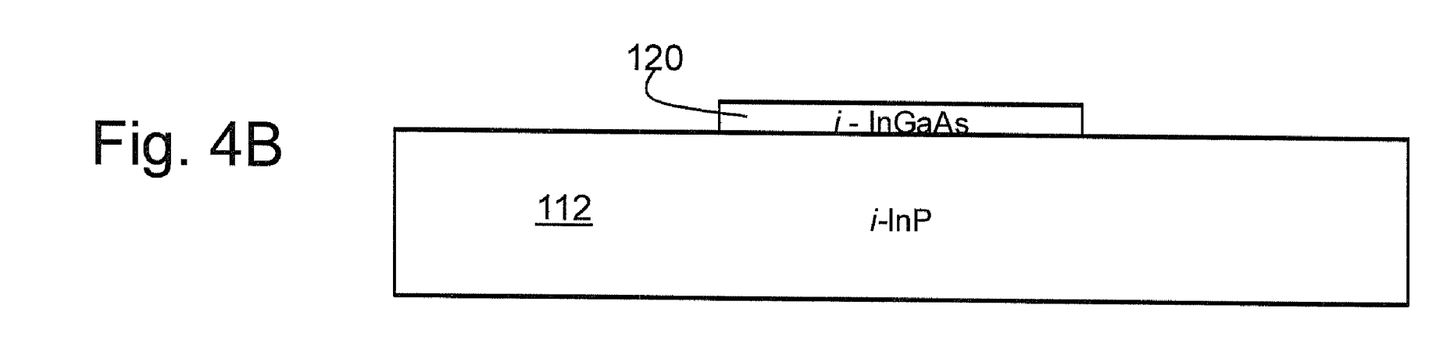
Figure 4C:
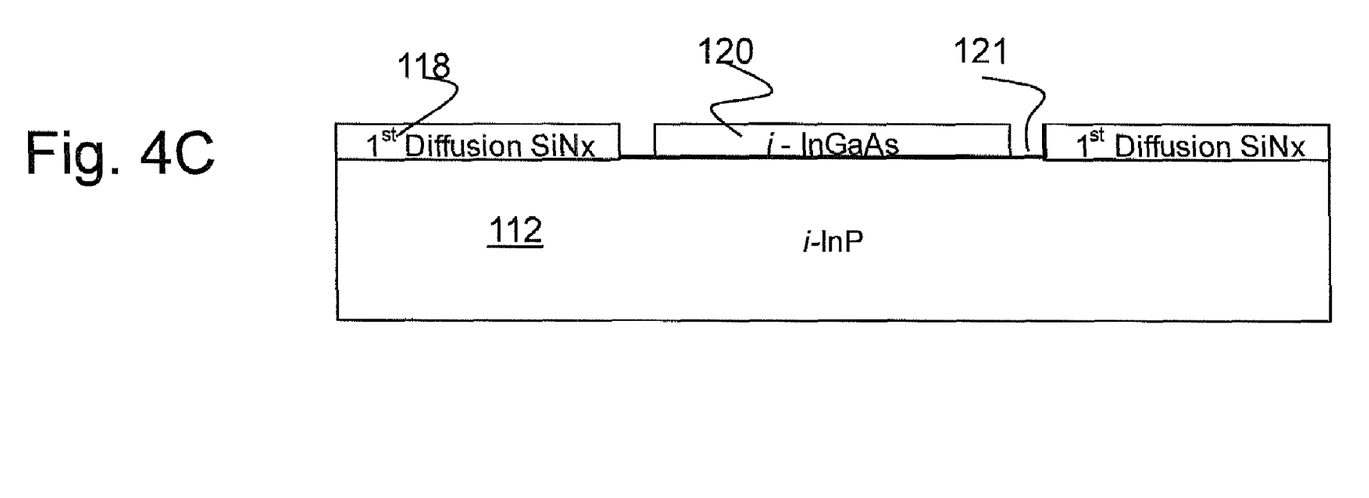
Figure 4D:
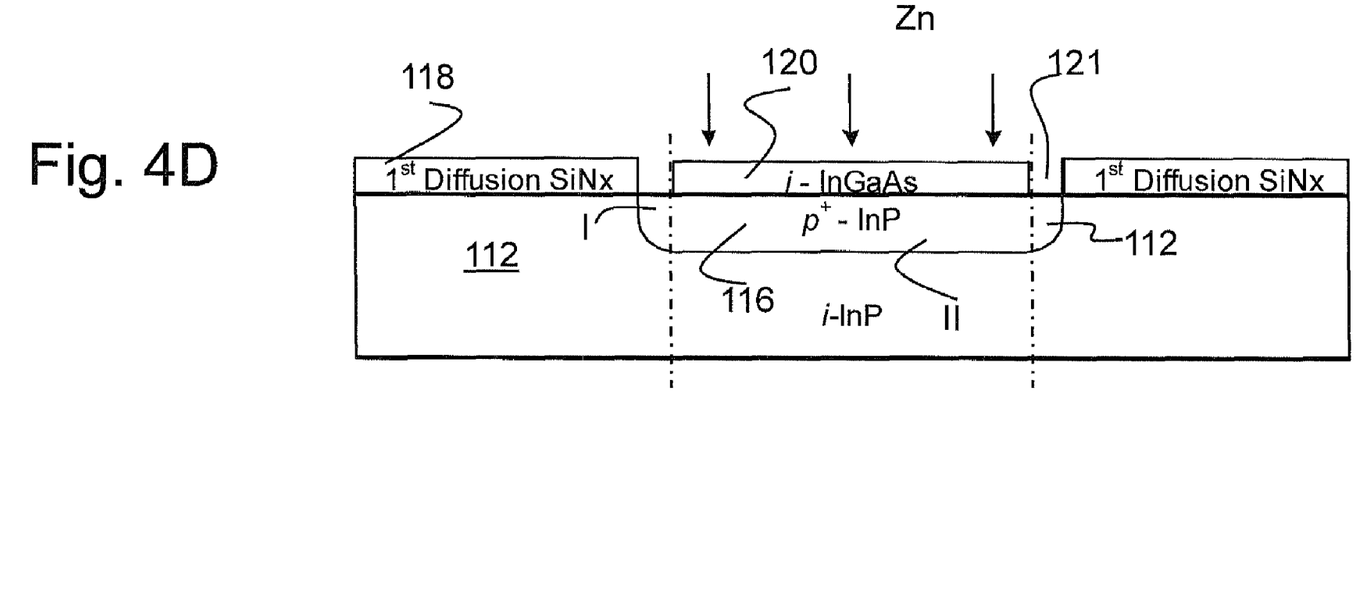
Figure 4E:
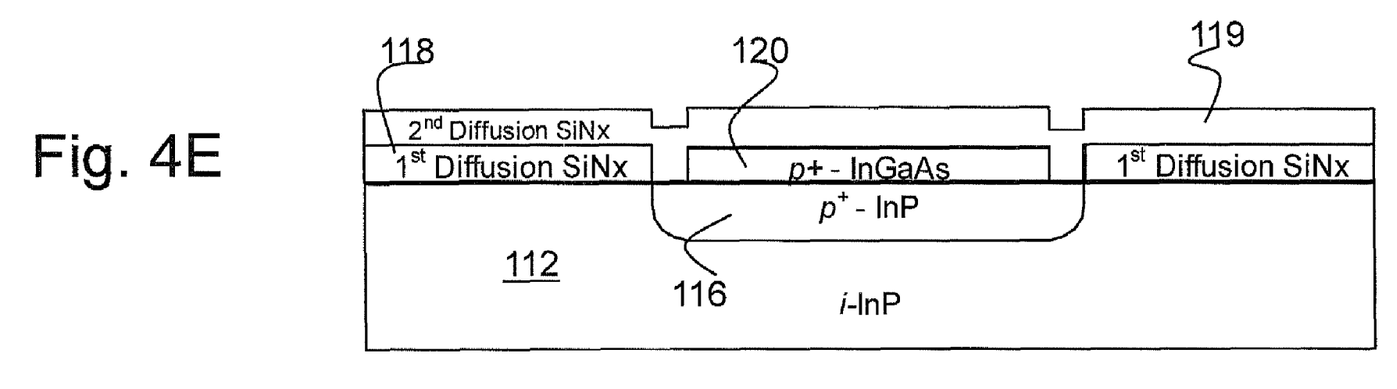
Figure 4F:
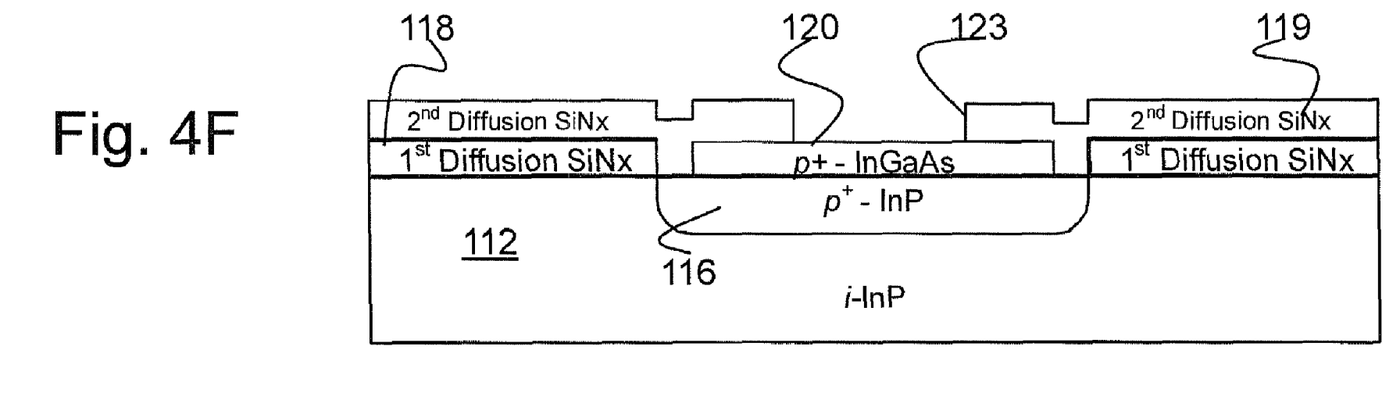
Figure 4G:
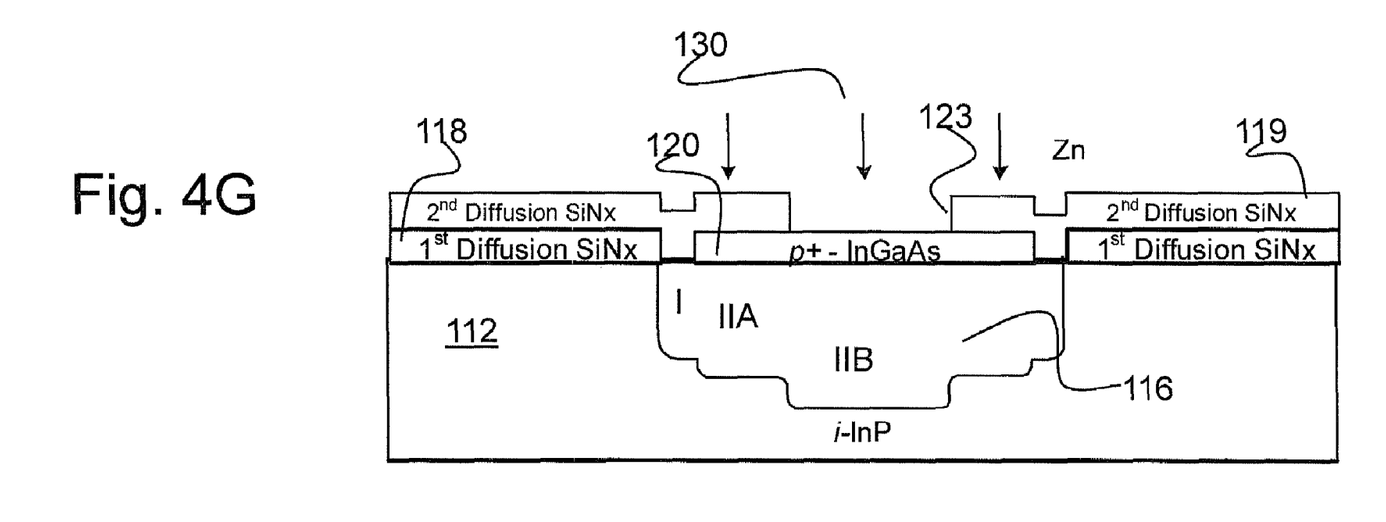

The method of forming the diffusion profile 114 is illustrated in the process flow of FIGS. 4A-J. FIG. 4A shows only the InP multiplication layer 112 with a layer of InGaAs 120 grown epitaxially over it. In FIG. 4B, the InGaAs layer 120 is etched to form a round slab by wet chemical etching. A first protective SiNx layer 118 is deposited and a first window 121 is opened by dry or wet chemical etching for a first diffusion as shown in FIG. 4C. Since the window 121 is larger in diameter than the slab 120, the diffusion is through InGaAs 120 and InP layer 112 in the center area region II, and directly into the InP only in the area of edge region I (and optionally floating guard rings 33 not shown) as shown in FIG. 4D. Next in FIG. 4E, a second protective SiNx layer 119 is deposited over the InGaAs slab 120, and a second window 123 is opened in FIG. 4F for a second diffusion. The second diffusion window 123 is smaller in diameter than the InGaAs slab 120, preferably by about 20 µm as shown in FIG. 4F. At the second diffusion in FIG. 4G, there are three regions with different diffusion sources seen more clearly in FIG. 2. The edge zone, labeled Region I, is InP 112 covered with SiNx 119, where the diffusion is only from the dopant introduced into the InP 112 from the first diffusion. The intermediate zone, labeled Region IIA, is InGaAs 120 and InP 112 covered with SiNx 119, where the diffusion is from the finite solid source 120. The central zone, labeled Region IIB, is InGaAs 120 and InP 112 opened through window 123 to Zn containing gas source 130, where the diffusion is from infinite source. The difference in radius of the InGaAs slab 120 to the second window 123 is preferably between one half and two thirds of the difference in radius between the first and second diffusion windows 121, 123.

In the central zone, Region IIB, diffusion from an infinite source can be expressed as $$N(x, t) = N_0 \left(1 - \text{erf} \frac{x}{2\sqrt{Dt}}\right)$$

Figure 6:
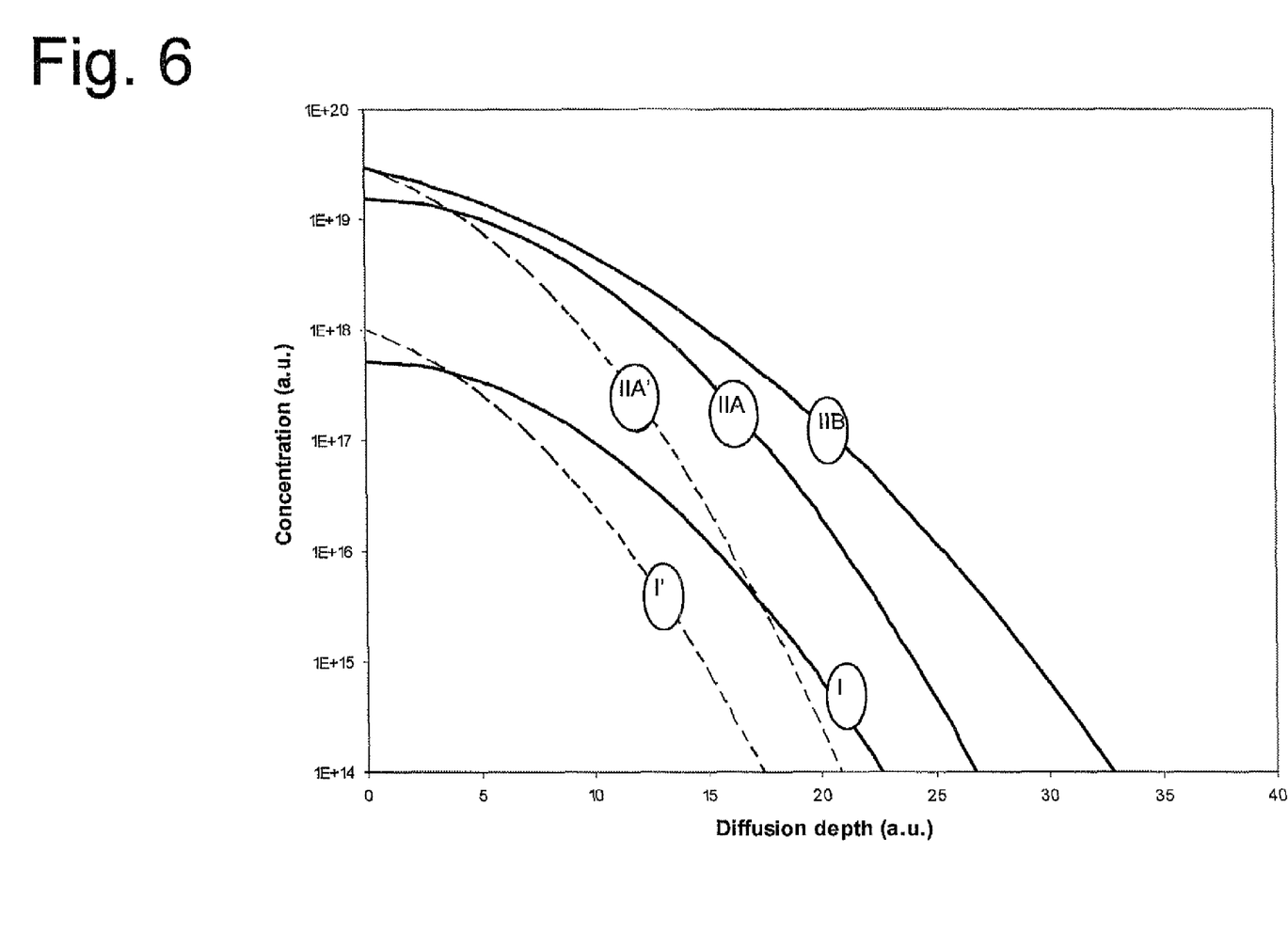
FIG. 6 is a graph of the diffusion depth at different regions in an active region made in accordance with the method of the present invention.

In edge zone and intermediate zone, region I and IIA, diffusion from a limited source can be expressed as $$N(x, t) = \frac{2N_0}{\pi} \sqrt{\frac{Dt}{D't'}} e^{-x^2/4D't'}$$

where $N_0$ is the surface concentration which is determined by Zn solubility in the material. The solubility of Zn in InGaAs is 10 times higher than that in InP. Therefore the surface concentration is much higher in region IIA than that in region I. As result, the diffusion depth of region IIA is greater than the diffusion depth of region I. The depth of region IIB, is selected by time and concentration control of the second diffusion to be deeper than region IIA, as shown in the graph in FIG. 6 of dopant concentration versus diffusion depth. Thus, the double diffusion with a solid source creates a smoothly transitioned edge profile with a highest concentration of dopant in the center area. The diffusion profile can be optimized through changing the thickness and diameter of InGaAs slab 120.

Figure 4H:
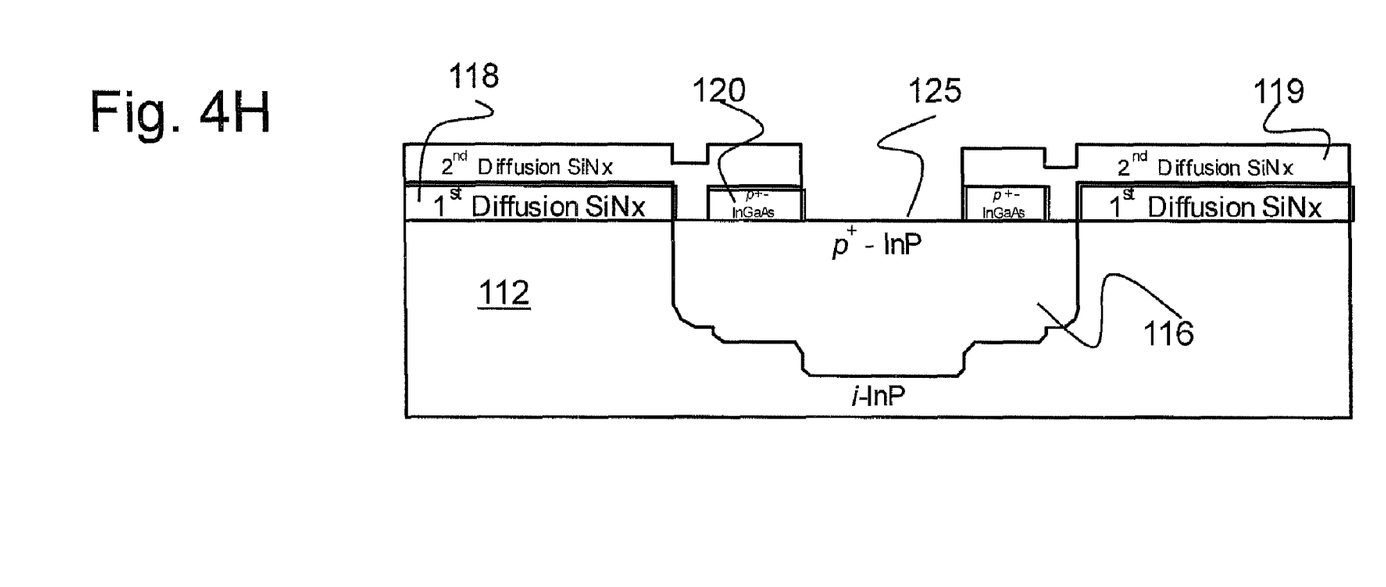
Figure 4I:
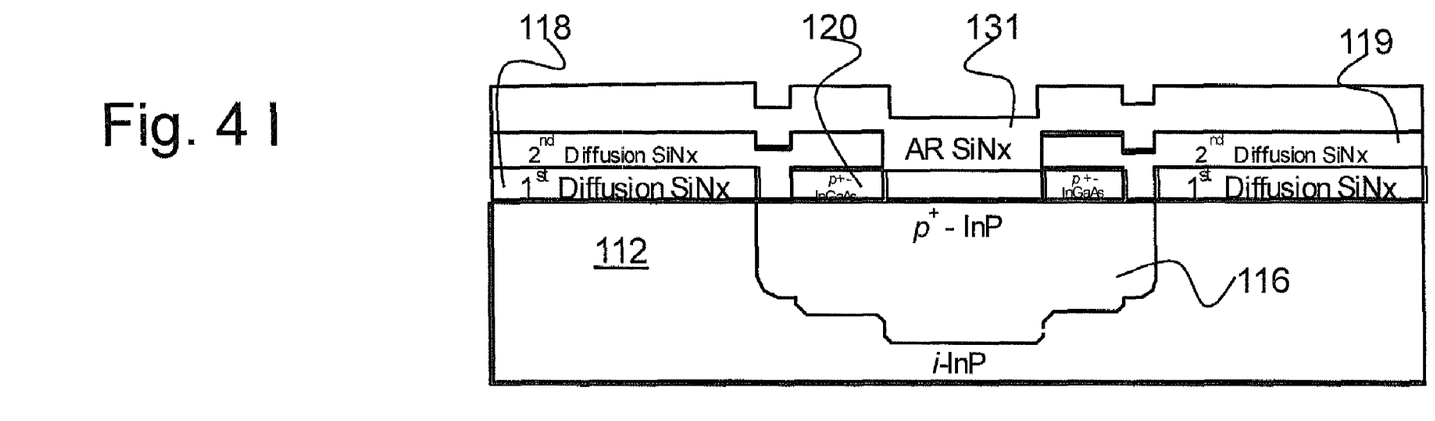
Figure 4J:
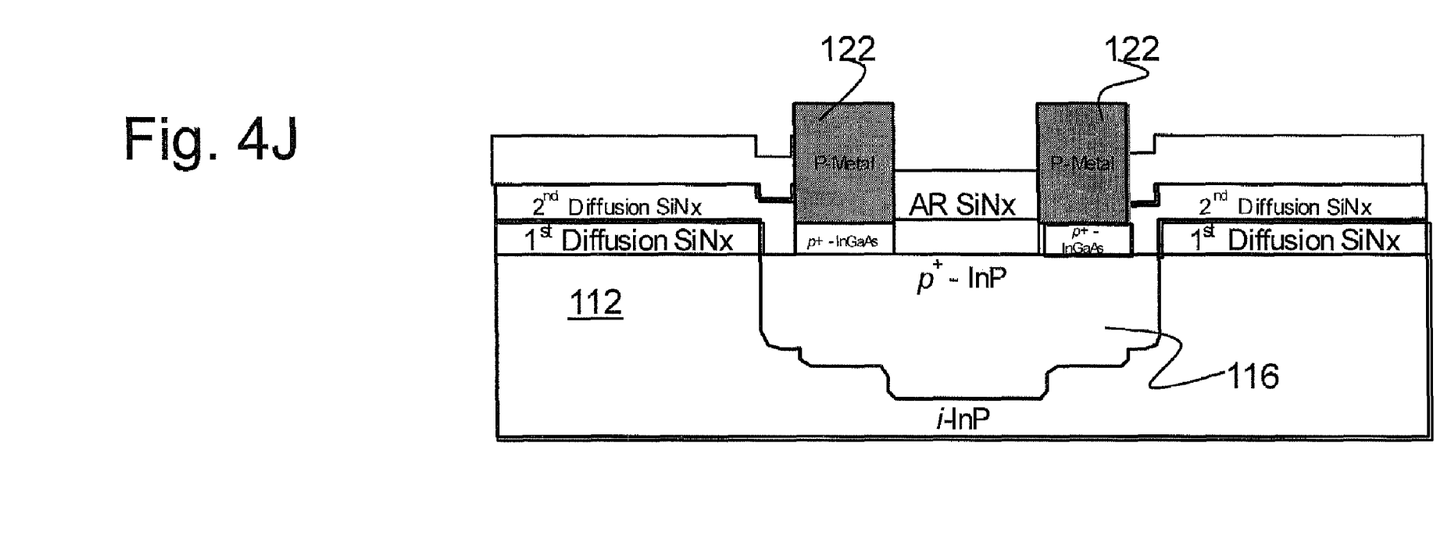
Figure 5A:
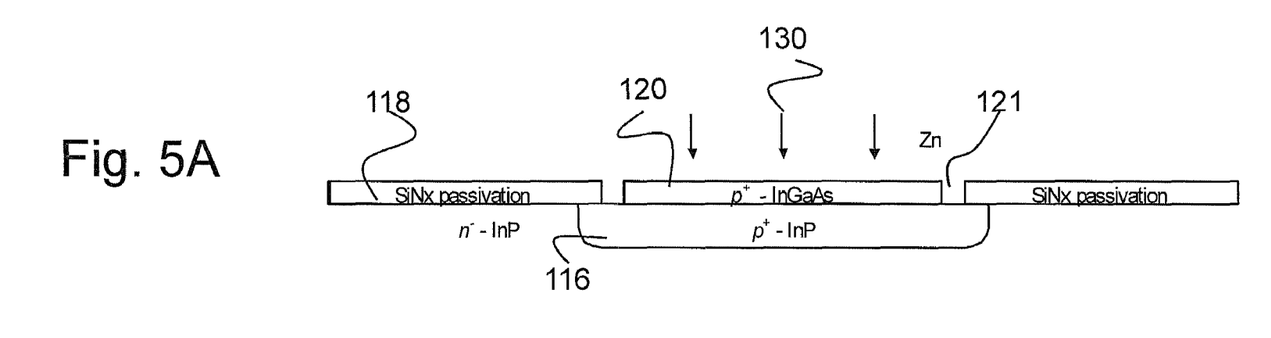
FIGS. 5A and 5B are schematic illustrations of the diffusion profile after a first and second diffusion step.
Figure 5B:
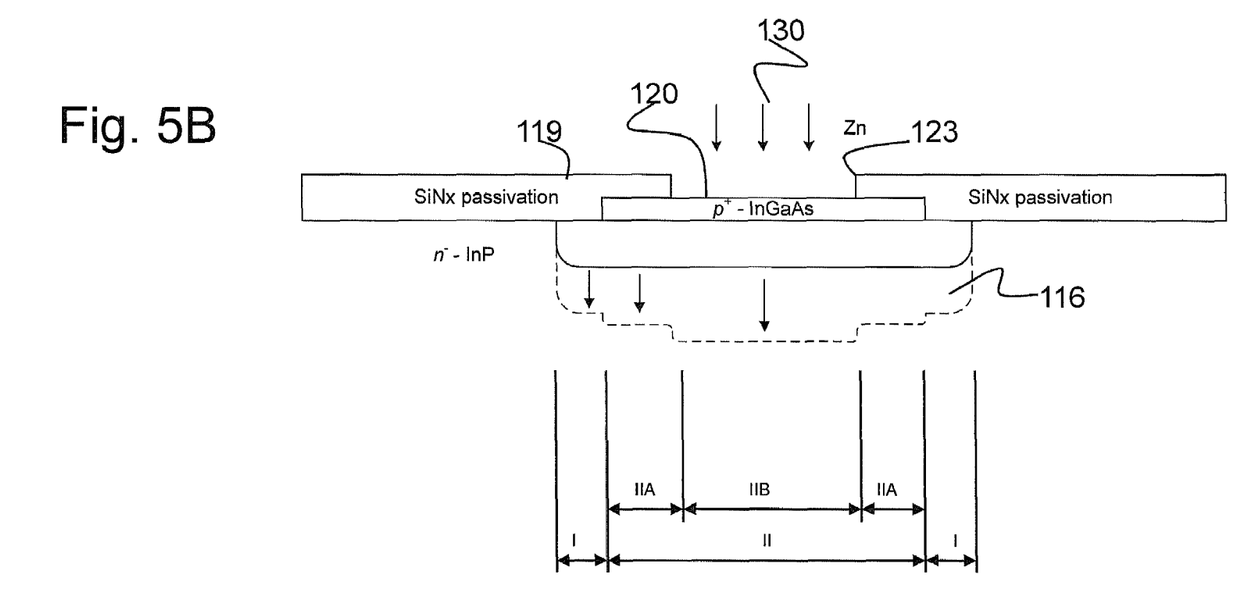

FIG. 4H shows removal of the InGaAs slab 120 in the light input window 125 by wet etching. As seen in FIG. 4I, an anti-reflection coating 131 of SiNx is deposited over the light input window 125. In FIG. 4J, the anti-reflection coating 131 is removed over the etched annular InGaAs slab 120 and additional p metal is evaporation coated over it as the p contact 122.

Other material combinations can achieve the profile tailoring advantage as disclosed if the material A for the multiplication layer and the material B for the slab layer are lattice matched, or if not lattice matched, can be grown with good material quality, and the difference of the dopant solubility between these two materials is large. The solubility of material B should be about 5 times or more greater than material A.

Alternative materials include InP or GaAs as the multiplication layer, and InGaAs or AlGaAs as the slab. Other dopants include Cadmium, Carbon, Magnesium and Beryllium. APDs can be based on GaAs substrate material as well as InP.

The embodiment(s) of the invention described above is(are) intended to be exemplary only. The scope of the invention is therefore intended to be limited solely by the scope of the appended claims.

What is claimed is:

1. A separate absorption and multiplication structure avalanche photodiode (SAM-APD) comprising:
   an epitaxial layer structure grown on an n-doped substrate in order as follows:
   an n-doped buffer layer;
   an unintentionally doped absorption layer;
   a grading layer;
   an n-doped field control layer;
   an unintentionally doped multiplication layer, including a diffused p-n junction having a diffusion profile and an active region comprising a diffusion region in the multiplication layer; and
   a solid source material layer;
   the device further comprising:
   a p-contact applied in electrical contact with the active region;
   a light input window; and
   an n-contact in electrical contact with the n-doped substrate,
   wherein the active region comprises an edge zone, an intermediate zone and a central zone arranged concentrically in monotonically increasing depth, and wherein the intermediate zone has a diameter approximately matching a diameter of the solid source material layer, such that
   the diffusion profile of the p-n junction comprises a smooth edge transition for suppressing edge breakdown.

2. A SAM-APD as defined in claim 1, wherein the solid source material layer comprises a material having a solubility to a dopant that is higher than a solubility of the multiplication layer to the dopant.

3. A SAM-APD as defined in claim 2, wherein the solid source material layer comprises a material having a solubility to a dopant that is at least five times higher than a solubility of the multiplication layer to the dopant.

4. A SAM-APD as defined in claim 3, wherein the multiplication layer is selected from the group consisting of: InP and GaAs and the solid source material is selected from the group consisting of: InGaAs and AlGaAs.

5. A SAM-APD as defined in claim 3, wherein the multiplication layer is InP and the solid source material is InGaAs.

6. A SAM-APD as defined in claim 5 wherein the InGaAs has a thickness of between 50 nm and 500 nm.

7. A SAM-APD as defined in claim 1, wherein the edge zone, the intermediate zone and the central zone are arranged concentrically in monotonically increasing depth and dopant concentration.

8. A SAM-APD as defined in claim 7, wherein a radius of the solid source material is larger than a radius of the central zone by approximately one half to two thirds the difference in radius of the edge zone and the central zone.

9. A SAM-APD as defined in claim 7, wherein the SAM-APD exhibits a substantially uniform gain across an active region of the device.

10. A SAM-APD as defined in claim 1 comprising a front illuminated APD.

11. A SAM-APD as defined in claim 1 comprising a back illuminated APD.

12. A SAM-APD as defined in claim 1, wherein the p-contact is formed on the solid source material layer.

13. A method of making a diffused p-n junction in the fabrication of a separate amplification and multiplication (SAM) avalanche photodiode (APD), the method comprising the steps of:
   a) growing a thin layer of solid source material on a multiplication layer;
   b) etching the solid source material to a dimension having a diameter Dint, exposing the multiplication layer around its edge;
   c) depositing a first protection layer over the exposed multiplication layer and solid source material;
   d) etching the first protection layer to open a first diffusion window having a diameter De larger than Dint, exposing the solid source material and a surrounding edge zone of the multiplication layer;
   e) conducting a first diffusion step by providing a source of dopant in an inert gas carrier over the surfaces exposed in the first diffusion window, and applying heat to cause the dopant to diffuse into the crystal lattice of the multiplication layer in the edge zone, and into the solid source in an intermediate and central zone;
   f) depositing a second protection layer over the first diffusion window;
   g) etching the second protection layer to expose a second diffusion window having a diameter Dc smaller than Dint positioned concentrically over the solid source material;
   h) conducting a second diffusion step by providing a source of dopant over the solid source material exposed in the second diffusion window, and applying heat to cause dopant diffused in the multiplication layer to migrate deeper into the multiplication layer in the edge zone, and to cause dopant diffused in the solid source material to migrate into the multiplication layer in the intermediate and central zone in greater concentration and deeper than in the edge zone, and to cause ions introduced through the second diffusion window to migrate into the multiplication layer in the central zone in greater concentration and deeper than in the intermediate zone,
   wherein the diffused p-n junction in the multiplication layer has a diffusion profile with a smooth edge transition curve from the edge zone to the central zone.

14. The method of making a diffused p-n junction as defined in claim 13, wherein the solid source material has a solubility to the dopant that is higher than the solubility of the multiplication layer to the dopant.

15. The method of making a diffused p-n junction as defined in claim 14, wherein the solid source material has a solubility to the dopant that is at least 5 times higher than the solubility of the multiplication layer to the dopant.

16. The method of making a diffused p-n junction as defined in claim 13, wherein the multiplication layer is selected from the group consisting of InP and GaAs and the solid source material is selected from the group consisting of InGaAs and AlGaAs.

17. The method of making a diffused p-n junction as defined in claim 16, wherein the multiplication layer is InP, the solid source material is InGaAs and the dopant is Zn.

18. The method of making a diffused p-n junction as defined in claim 17, wherein the InGaAs has a thickness of 50-500 nm.

19. The method of making a diffused p-n junction as defined in claim 13, wherein the edge zone, intermediate zone and central zone are concentric substantially circular areas.

20. The method of making a diffused p-n junction as defined in claim 19, wherein a radius of the solid source material is larger than a radius of the second diffusion window by approximately one half to two thirds the difference in radius of the first and second diffusion windows.

21. The method of making a diffused p-n junction as defined in claim 13, wherein the solid source material is plated with p-metal as the p contact of the APD.

* * * * *